(12) United States Patent
Stavenga et al.

(10) Patent No.: US 8,405,817 B2
(45) Date of Patent: Mar. 26, 2013

(54) LITHOGRAPHIC APPARATUS, A METHOD OF CONTROLLING THE APPARATUS AND A DEVICE MANUFACTURING METHOD

(75) Inventors: Marco Koert Stavenga, Eindhoven (NL); Nicolaas Rudolf Kemper, Eindhoven (NL); Martinus Hendrikus Antonius Leenders, Rhoon (NL); Paulus Martinus Maria Liebregts, Veldhoven (NL); Johannes Catharinus Hubertus Mulkens, Valkenswaard (NL); Erik Henricus Egidius Catharina Eummelen, Eindhoven (NL); Richard Moerman, Son (NL); Michel Riepen, Veldhoven (NL); Sergei Shulepov, Eindhoven (NL); Gert-Jan Gerardus Johannes Thomas Brands, Waalre (NL); Koen Steffens, Veldhoven (NL); Jan Willem Cromwijk, Best (NL); Ralph Joseph Meijers, Kerkrade (NL); Fabrizio Evangelista, Eindhoven (NL); David Bessems, Eindhoven (NL); Hua Li, Eindhoven (NL); Marinus Jochemsen, Veldhoven (NL); Pieter Lein Joseph Gunter, Weert (NL); Franciscus Wilhelmus Bell, Best (NL); Erik Witberg, Breda (NL); Marcus Agnes Johannes Smits, Hamont-Achel (BE); Zhenhua Ma, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 399 days.

(21) Appl. No.: 12/697,583

(22) Filed: Feb. 1, 2010

(65) Prior Publication Data
US 2010/0214543 A1 Aug. 26, 2010

Related U.S. Application Data

(60) Provisional application No. 61/153,941, filed on Feb. 19, 2009, provisional application No. 61/187,496, filed on Jun. 16, 2009.

(51) Int. Cl.
*G03B 27/42* (2006.01)
*G03B 27/52* (2006.01)
(52) U.S. Cl. .................................. 355/53; 355/30
(58) Field of Classification Search .................. 355/30, 355/53; 250/548
See application file for complete search history.

(56) References Cited

U.S. PATENT DOCUMENTS
(Continued)

FOREIGN PATENT DOCUMENTS
CN 1550905 12/2004
EP 1 420 300 A2 5/2004
(Continued)

OTHER PUBLICATIONS

Korean Office Action dated Aug. 31, 2011 in corresponding Korean Patent Application No. 10-2010-0056706.

(Continued)

*Primary Examiner* — Hung Henry Nguyen
(74) *Attorney, Agent, or Firm* — Pillsbury Winthrop Shaw Pittman LLP

(57) ABSTRACT

A method of operating a lithographic apparatus is disclosed. The method includes moving a substrate table supporting a substrate relative to a projection system and adjusting the scanning speed between the substrate table and the projection system during imaging of a target within a predefined area at or near an edge of the substrate, or adjusting the stepping speed between adjacent target positions in a predefined area at or near the edge of the substrate, or both. The adjusting the scanning and/or stepping speed may comprise lowering the speed. The projection system is configured to project a patterned beam of radiation on to a target portion of the substrate.

20 Claims, 7 Drawing Sheets

U.S. PATENT DOCUMENTS

| | | | |
|---|---|---|---|
| 4,509,852 | A | 4/1985 | Tabarelli et al. |
| 7,352,434 | B2 | 4/2008 | Streefkerk et al. |
| 7,518,708 | B2 | 4/2009 | Emoto |
| 7,742,150 | B2 | 6/2010 | Ito et al. |
| 7,755,740 | B2 * | 7/2010 | Tsukamoto et al. ............ 355/53 |
| 7,907,250 | B2 * | 3/2011 | Ito .................................. 355/30 |
| 8,064,037 | B2 | 11/2011 | Nagasaka et al. |
| 2004/0136494 | A1 | 7/2004 | Lof et al. |
| 2004/0207824 | A1 | 10/2004 | Lof et al. |
| 2005/0007569 | A1 | 1/2005 | Streefkerk et al. |
| 2006/0038968 | A1 | 2/2006 | Kemper et al. |
| 2006/0119809 | A1 | 6/2006 | Verhagen et al. |
| 2006/0197930 | A1 | 9/2006 | Kawashima et al. |
| 2007/0146663 | A1 | 6/2007 | Nagasaka |
| 2007/0188733 | A1 | 8/2007 | Ito et al. |
| 2007/0243697 | A1 | 10/2007 | Leenders et al. |
| 2008/0111979 | A1 | 5/2008 | Emoto |
| 2008/0117398 | A1 | 5/2008 | Emoto |
| 2008/0186462 | A1 | 8/2008 | Shima |
| 2008/0187872 | A1 | 8/2008 | Tsukamoto et al. |
| 2008/0198351 | A1 | 8/2008 | Lin et al. |
| 2008/0212046 | A1 | 9/2008 | Riepen et al. |
| 2008/0246934 | A1 | 10/2008 | Biggelaar et al. |
| 2008/0246937 | A1 | 10/2008 | Nagasaka |
| 2008/0297749 | A1 | 12/2008 | Wirtz |
| 2009/0161089 | A1 | 6/2009 | Leenders et al. |
| 2009/0262318 | A1 | 10/2009 | Van Den Dungen et al. |
| 2010/0002206 | A1 | 1/2010 | Kida et al. |
| 2010/0033698 | A1 | 2/2010 | Sewell |
| 2010/0214543 | A1 | 8/2010 | Stavenga et al. |

FOREIGN PATENT DOCUMENTS

| | | | |
|---|---|---|---|
| EP | 1703548 | | 9/2006 |
| EP | 1865539 | | 12/2007 |
| EP | 1879219 | | 1/2008 |
| EP | 1921504 | | 5/2008 |
| EP | 2073062 | | 6/2009 |
| EP | 2151717 | | 2/2010 |
| EP | 2199859 | | 6/2010 |
| JP | WO99/49504 | * | 3/1998 |
| JP | 2007-194484 | | 8/2007 |
| JP | 2007-287824 | | 11/2007 |
| JP | 2008-091424 | | 4/2008 |
| JP | 2008-124194 | | 5/2008 |
| JP | 2008300771 | | 11/2008 |
| KR | 10-2006-0109888 | | 10/2006 |
| WO | 99/49504 A1 | | 9/1999 |
| WO | 2005/020299 | | 3/2005 |
| WO | 2005/064405 A2 | | 7/2005 |
| WO | 2005078777 | | 8/2005 |
| WO | 2006/106832 | | 10/2006 |

OTHER PUBLICATIONS

Japanese Office Action dated Jan. 5, 2012 in corresponding Japanese Patent Application No. 2010-029605.

European Search Report dated Jan. 11, 2011 in European patent application No. 10151945.

European Search Report dated Jan. 11, 2011 in European patent application No. 10164478.

Korean Office Action mailed May 26, 2011 in corresponding Korean Patent Application No. 10-2010-0015246.

Korean Office Action mailed Jul. 5, 2012 in corresponding Korean Patent Application No. 10-2010-0015246.

Korean Office Action mailed Apr. 30, 2012 in corresponding Korean Patent Application No. 10-2010-0015246.

Chinese Office Action dated Oct. 8, 2012 in corresponding Chinese Patent Application No. 201010213165.9.

U.S. Office Action dated Dec. 13, 2012 in corresponding U.S. Appl. No. 12/814,325.

* cited by examiner

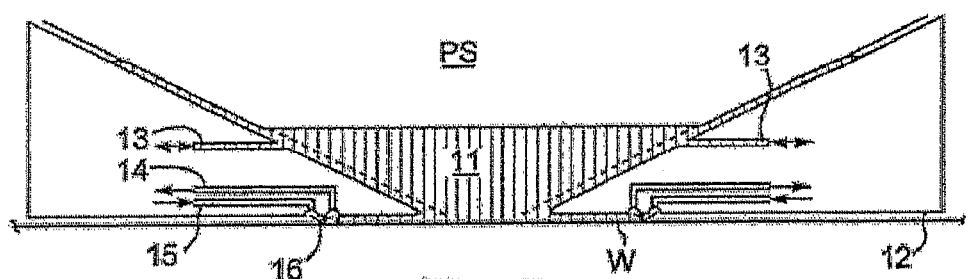
Fig. 5
(PRIOR ART)
Fig. 6
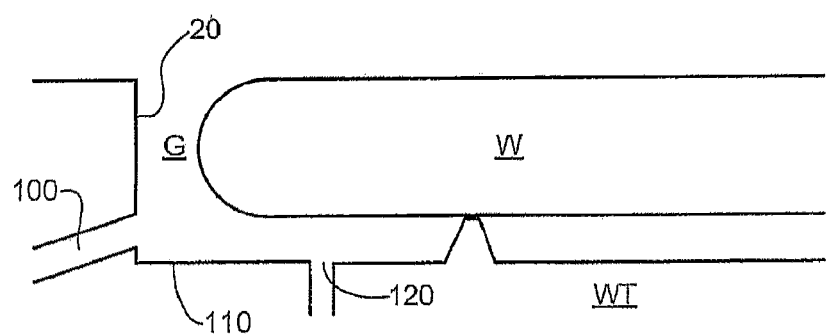

LITHOGRAPHIC APPARATUS, A METHOD OF CONTROLLING THE APPARATUS AND A DEVICE MANUFACTURING METHOD

This application claims priority and benefit under 35 U.S.C. §119(e) to U.S. Provisional Patent Application No. 61/153,941, entitled "A Lithographic Apparatus, A Method of Controlling the Apparatus and A Device Manufacturing Method", filed on Feb. 19, 2009 and to U.S. Provisional Patent Application No. 61/187,496, entitled "A Lithographic Apparatus, A Method of Controlling the Apparatus and A Device Manufacturing Method", filed on Jun. 16, 2009. The content of each of the foregoing applications is incorporated herein in its entirety by reference.

FIELD

The present invention relates to a lithographic apparatus, a method of controlling the lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak (or flow) over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

SUMMARY

In immersion lithography some liquid may be lost from the space onto a substrate being exposed. The lost liquid may pose a defectivity risk. A droplet of liquid present on the substrate which later collides with liquid in the space, for example the meniscus of the liquid, may cause the formation of a volume of gas, such as a bubble within the space. The bubble may interfere with imaging radiation directed towards a target portion of the substrate to affect the imaged pattern on the substrate.

It is desirable, for example, to reduce or eliminate the risk of such imaging defects.

According to an aspect, there is provided an immersion lithographic apparatus comprising:

a substrate table configured to support a substrate;

a projection system configured to direct a patterned beam of radiation onto a substrate;

a liquid handling system configured to supply and confine immersion liquid to a space defined between a projection system and a substrate, or the substrate table, or both;

a controller to adjust an operating condition of the apparatus during motion of a substrate and/or substrate table relative to the liquid handling system when a predefined area of the substrate and/or substrate table is under the liquid handling system.

According to an aspect, there is provided a method of operating a lithographic apparatus, the method comprising:

moving a substrate table supporting a substrate relative to a projection system configured to project a patterned beam of radiation through immersion liquid, confined by a liquid handling system, onto a substrate; and adjusting an operating condition of the apparatus during motion of the substrate and/or substrate table relative to the liquid handling system when a predefined area of the substrate and/or substrate table is under the liquid handling system.

According to an aspect, there is provided an immersion lithographic apparatus comprising: a substrate table configured to support a substrate; a projection system configured to direct a patterned beam of radiation on to a substrate; a liquid handling system configured to supply and confine immersion liquid to a space defined between the projection system and the substrate, or the substrate table, or both; a positioning system configured to determine the relative position of the substrate, or the substrate table, or both, relative to the liquid handling structure, or the projection system, or both; and a controller constructed and arranged to control relative motion between the substrate, or the substrate table, or both, and the liquid handling structure, or the projection system, or both, wherein the controller is configured to lower: the scanning speed between the substrate table and the projection system during imaging of a target within a predefined area at or near an edge of the substrate, or the stepping speed between adjacent target positions in a predefined area at or near the edge of the substrate, or both.

According to an aspect of the invention, there is provided a method of operating a lithographic apparatus, the method comprising: moving a substrate table supporting a substrate relative to projection system configured to project a patterned beam of radiation on to a target portion of the substrate; and adjusting the scanning speed between the substrate table and the projection system during imaging of a target within a predefined area at or near an edge of the substrate, or adjusting the stepping speed between adjacent target positions in a predefined area at or near the edge of the substrate, or both, wherein adjusting the scanning or stepping speed comprises lowering the speed.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts a further liquid supply system for use in a lithographic projection apparatus;

FIG. 6 depicts, in cross-section, an edge of a substrate and the surrounding substrate table;

DETAILED DESCRIPTION

Figure 1:
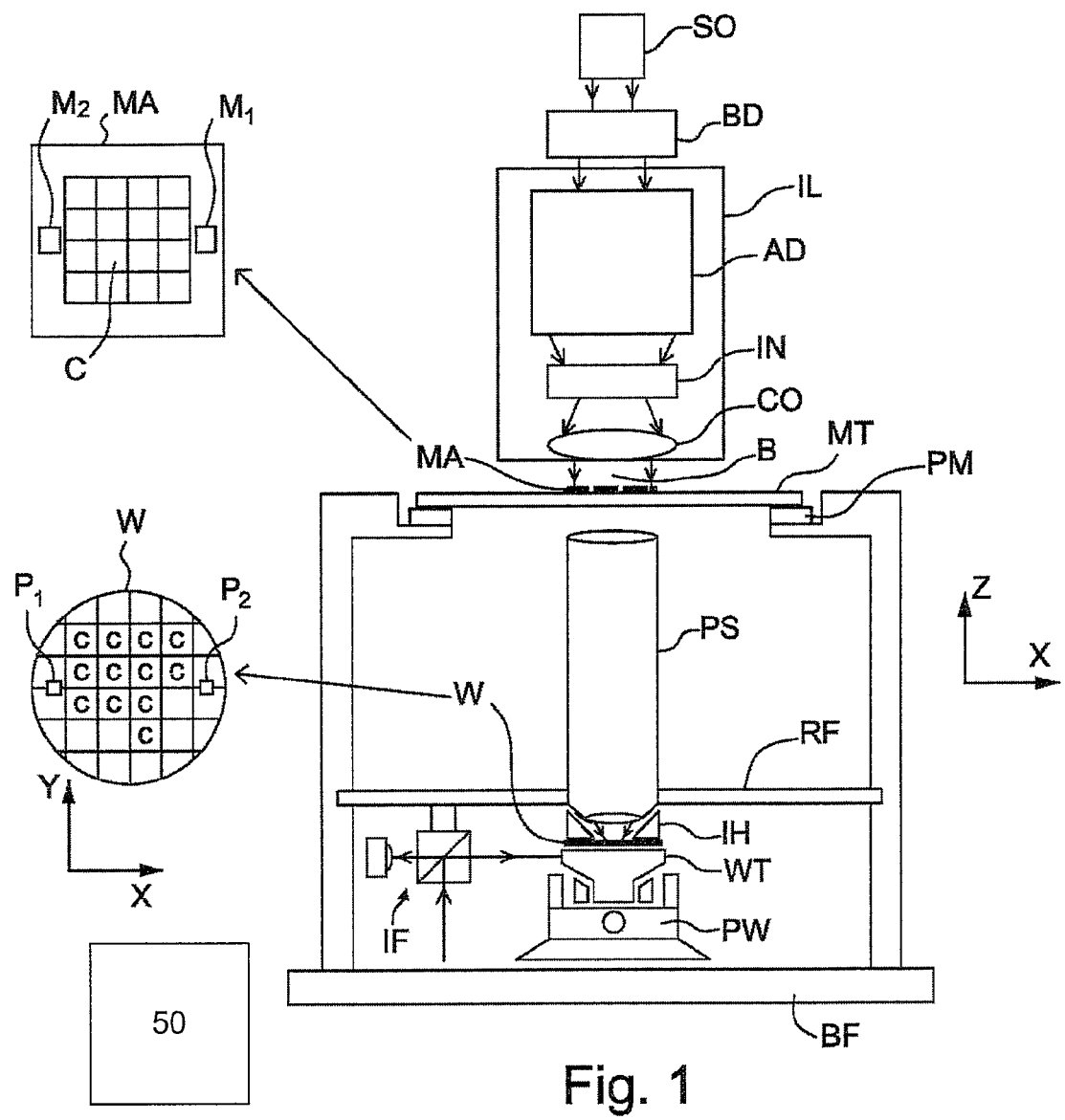
FIG. 1 depicts a lithographic apparatus according to an embodiment of the invention.
Figure 2:
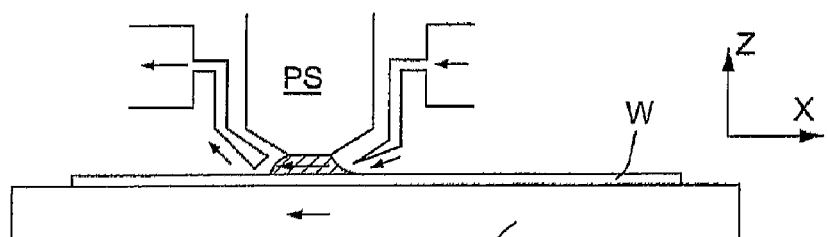
FIGS. 2 and 3 depict a liquid supply system for use in a lithographic projection apparatus.
Figure 3:
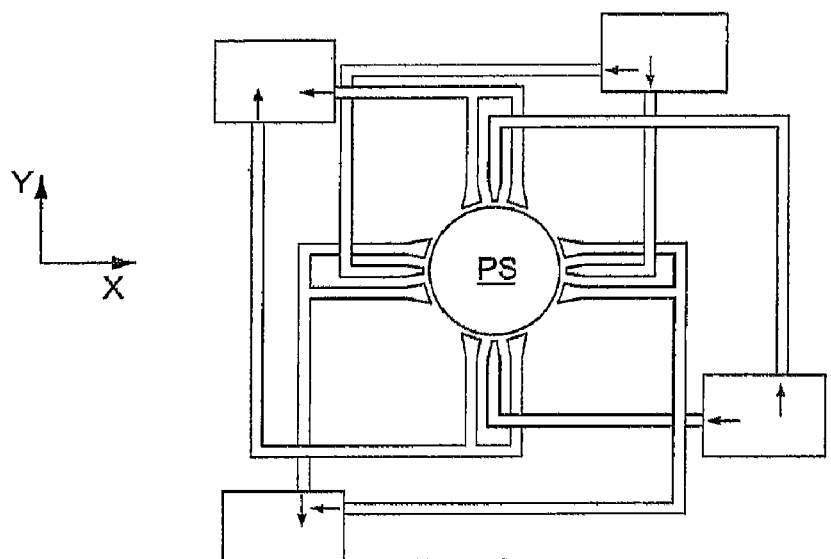
Figure 4:
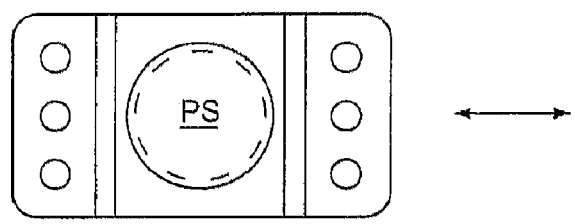
FIG. 4 depicts a further liquid supply system for use in a lithographic projection apparatus.
Figure 4:
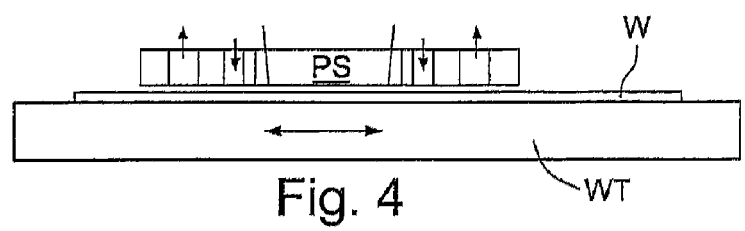

FIG. 1 schematically depicts a lithographic apparatus according to one embodiment of the invention. The apparatus comprises:

- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device MA in accordance with certain parameters;
- a substrate table (e.g. a wafer table) WT constructed to hold a substrate (e.g. a resist-coated wafer) W and connected to a second positioner PW configured to accurately position the substrate W in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. A further arrangement, to which an embodiment of the invention is directed, is the all wet solution in which the liquid is unconfined In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 were described above.

Another arrangement which has been proposed is to provide the liquid supply system with a fluid confinement structure. The fluid confinement structure may extends along at least a part of a boundary of the space between the final element of the projection system and the substrate table. Such an arrangement is illustrated in FIG. 5. The fluid confinement structure is substantially stationary relative to the projection system in the XY plane though there may be some relative movement in the Z direction (in the direction of the optical axis). A seal is formed between the fluid confinement structure and the surface of the substrate. In an embodiment, a seal is formed between the fluid confinement structure and the surface of the substrate and may be a contactless seal such as a gas seal. Such a system is disclosed in United States patent application publication no. US 2004-0207824.

FIG. 5 schematically depicts a localized liquid supply system or fluid handling structure or device with a body 12 forming a barrier member or fluid confinement structure, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) The fluid handling structure is substantially stationary relative to the projection system PS in the XY plane though there may be some relative movement in the Z direction (in the direction of the optical axis). In an embodiment, a seal is formed between the body 12 and the surface of the substrate W and may be a contactless seal such as a gas seal or fluid seal.

The fluid handling device at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the body 12 positioned below and surrounding the final element of the projection system PS. Liquid is brought into the space 11 below the projection system PS and within the body 12 by liquid inlet 13. The liquid may be removed by liquid outlet 13. The body 12 may extend a little above the final element of the projection system PS. The liquid level rises above the final element so that a buffer of liquid is provided. In an embodiment, the body 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid is contained in the space 11 by the gas seal 16 which, during use is formed between the bottom of the body 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between body 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the body 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

The example of FIG. 5 is a so called localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no US 2006-0038968. In an embodiment, a single or two phase extractor may comprise an inlet which is covered in a porous material. In an embodiment of a single phase extractor the porous material is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 300 µm, desirably 5 to 50 µm. In an embodiment, the porous material is at least slightly liquidphilic (e.g., hydrophilic), i.e. having a contact angle of less than 90° to the immersion liquid, e.g. water.

Another arrangement which is possible is one which works on a gas drag principle. The so-called gas drag principle has been described, for example, in United States patent application publication no. US 2008-0212046 and U.S. patent application no. U.S. 61/071,621 filed on 8 May 2008. In that system the extraction holes are arranged in a shape which desirably has a corner. The corner may be aligned with the stepping or scanning directions. This reduces the force on the meniscus between two openings in the surface of the fluid handling structure for a given speed in the step or scan direction compared to if the two outlets were aligned perpendicular to the direction of scan.

Also disclosed in US 2008-0212046 is a gas knife positioned radially outside the main liquid retrieval feature. The gas knife traps any liquid which gets past the main liquid retrieval feature. Such a gas knife may be present in a so called gas drag principle arrangement (as disclosed in US 2008-0212046), in a single or two phase extractor arrangement (such as disclosed in United States patent application publication no. US 2009-0262318) or any other arrangement.

An embodiment of the invention may be applied to a fluid handling structure used in all wet immersion apparatus. In the all wet embodiment, fluid is allowed to cover the whole of the top surface of the substrate table, for example, by allowing liquid to leak out of a confinement structure which confines liquid to between the final element of projection system and the substrate. An example of a fluid handling structure for an all wet embodiment can be found in U.S. patent application no. U.S. 61/136,380 filed on 2 Sep. 2008.

Many other types of liquid supply system are possible. The present invention is not limited to any particular type of liquid supply system. The present invention may be advantageous for use with a confined immersion system in which the liquid between the final element of the projection system and the substrate is confined, for example, in optimizing the use. However, the invention can be used with any other type of liquid supply system.

As illustrated in FIG. 6, a substrate holder may be used to support the substrate W. The substrate table WT supports the substrate holder. The substrate holder may be in a recess within the substrate table WT. The depth of the recess may be sized so that when a substrate W is present on the substrate holder the surface of the substrate W is substantially co-planar with the top surface of the substrate table WT. When a substrate W is present on the substrate support, there may be a gap G between the substrate W edge and a facing edge 20 of the substrate table.

In the gap G, there may be a defined gap opening, which in an embodiment may be a plurality of gap openings 100, of a fluid extraction device to remove liquid from the gap G during operation. The gap opening 100 may be located near the edge of the recess (e.g. at a radially outward position to the substrate W). An opening (or one or more under-openings 120) may be present at or near the periphery of the substrate support. This opening may be covered by a substrate W during operation, so that liquid may be removed from under the substrate W through the under opening 120.

In an immersion system, such as a confined immersion system, immersion liquid may escape from the liquid confinement structure 12. The escaped liquid may settle on a surface of the substrate table or the substrate being imaged. The escaped liquid may be in the form of a droplet or a film (hereinafter droplet refers to droplet and/or film) The droplet may be the cause of several defectivity problems.

The position of the droplet on the substrate W or substrate table WT may pass under the liquid confinement structure 12. A defectivity problem may be caused by the collision of the droplet with the confined liquid. For example, in a confined immersion system, the droplet may collide with the liquid meniscus which extends between the liquid confinement structure 12 and the substrate W. Such a collision may cause liquid to enclose gas (e.g., air) as a bubble, which may be, for example, 5-10 µm in diameter but may be 1-500 µm in diameter. The bubble size may be typically between 5 and 10 microns. The bubble may move through the immersion liquid into the space 11 between the projection system PS and the substrate W or the bubble may be stationary on the substrate W and be moved into the space 11 by relative motion of the substrate W relative to the space 11. A bubble present at this location may affect imaging, i.e. the bubble may be exposed into the resist causing an imaging defect.

The risk of escaping liquid increases when an edge of a substrate W moves under the liquid confinement structure 12, for example after imaging a line of dies which cross the substrate or at the beginning of imaging a line of dies. In crossing the substrate edge, the substrate edge and substrate table WT move under the liquid confinement structure 12 so that the immersion space 11 is defined by the substrate table WT surface instead of the substrate W surface. In moving the substrate W from under the projection system PS to be replaced by the substrate table WT, the gap G passes under the projection system PS. This can cause the meniscus to lose stability. As a result liquid may escape.

Note this problem may be less relevant for an all-wet immersion system where immersion liquid covers at least the entirety of the surface of the substrate W and desirably some of the surrounding surface of the substrate table WT.

In an embodiment of the invention a controller 50 is configured to adjust one or more operating conditions of the lithographic apparatus. For example, the controller may be configured to adjust one or more operating conditions of the liquid confinement structure 12 and/or of the positioning system PW configured to position the substrate W and/or substrate table WT relative to the projection system PS and/or liquid confinement structure 12. Therefore the controller 50 changes one or more operating conditions from the operating conditions determined by one or more main controllers. That is, the controller 50 sets the one or more operating conditions to be different to the operating conditions which would be selected in absence of the controller 50.

The one or more operating conditions may include the speed of the substrate W and/or substrate table WT with respect to the liquid confinement structure 12 and/or projection system PS.

The controller 50 may alternatively or additionally adjust the flow-rate of the immersion fluid provided to the space 11 between the projection system PS and the substrate 11.

Alternatively or additionally, the controller 50 may adjust the level of an under-pressure source that is used to extract the immersion fluid from the space 11 between the projection system PS and the substrate W.

Alternatively or additionally, in an immersion lithographic apparatus that utilizes a gas knife to control the immersion fluid and, for example, reduce the loss of the immersion fluid from the space 11, the controller 50 may adjust (e.g. increase) the gas flow rate to be used in the gas knife.

Alternatively or additionally, in such an immersion lithographic apparatus utilizing a gas knife, the controller 50 may determine a desired composition of the gas to be used in the gas knife or a parameter based on the composition, such as the level to which the gas is saturated with vapor of the immersion liquid.

The controller 50 may alternatively or additionally change the distance between the bottom of the liquid confinement structure 12 and the surface of the substrate W and/or substrate table WT.

The controller 50 may alternatively or additionally tilt the liquid confinement structure 12 such that the bottom surface of the liquid confinement structure 12 is not parallel to the top surface of the substrate W and/or substrate table WT. That is, the bottom surface of the liquid confinement structure 12 may be angled away from being parallel to the top surface of the substrate W and/or substrate table WT.

The controller 50 may alternatively or additionally set the flow-rate of fluid extraction out of an opening 100, 120 in a gap between the substrate table WT and the substrate W.

The controller 50 may alternatively or additionally set the flow-rate of immersion liquid into the immersion space.

The controller 50 may alternatively or additionally vary the distribution of the various flows of fluid in the liquid handling structure 12 peripherally, e.g., circumferentially. That is, a larger flow could be created on one side (in plan) of the liquid confinement structure 12 than on the opposite side of the liquid confinement structure 12. This applies to both fluids exiting the liquid confinement structure 12 and fluids entering the liquid confinement structure. That is, the fluid flow rate into and/or out of openings of the liquid handling system is varied dependent upon the angular position of an opening relative to the direction of motion.

Other operating conditions or any combination of operating conditions may alternatively or additionally be determined by the controller 50.

A significant parameter affecting the likelihood of bubble formation in the immersion space 11 is the speed of the substrate W with respect to the liquid confinement structure 12. An embodiment of the invention will now be described with reference to the controller 50 setting the speed of the substrate W with respect to the liquid confinement structure 12. However, any additional or alternative operating condition, in particular those mentioned above, could be set in the same way as described below.

The method can be used when other features pass under the projection system 12 for example during crossing a surface and approaching an edge of the surface such as approaching the gap between the substrate table and a bridge or sensor. Other surfaces where an embodiment of the invention could be used include surfaces which are likely to be lyophilic surfaces or at least have portions which are a reduced contact angle, such as a sensor. Because other features passing under the projection system 12 can result in instability of the meniscus, in one embodiment the controller adjusts the one or more operating conditions of the apparatus when the motion is close to a feature, such as a sensor. For sensors, such as a lens interferometer (e.g., an ILIAS), or a transmission image sensor, or a spot sensor, the gas knife of the liquid confinement structure 12 could be turned off or have its flow rate reduced in order to avoid liquid loss on the lyophillic parts of those sensors.

When the routing of a substrate table WT is such that liquid loss could occur under normal operating conditions, setting the speed of the substrate table WT at a lower velocity can help alleviate the risk of forming a bubble. A controller 50 configured to control the movement of the substrate table WT in this manner may be referred to as an edge speed limiter.

In an embodiment of the invention the scan speed for imaging a target or target die is limited, for example in the vicinity of an edge of the substrate W. In an embodiment, the step speed is not adjusted. In an embodiment the scan speed is not adjusted.

The positioning of the edge of the substrate W may be made with reference to co-ordinates with respect to the substrate table WT. It is desirable to use a positioning system PW in which the co-ordinates are with respect to the substrate W. It is desirable because the precise position of the substrate W and thus its edge is unpredictable. The slowing of the scan speed may be insufficient to prevent a bubble from forming. In an embodiment, a manual override may be provided to limit the speed during scanning of certain dies. In an embodiment, no manual override is provided. In an embodiment the manual override may be used to increase the speed during scanning of certain dies. This may allow an increase in throughput if experience shows an operator that increasing the speed through scanning of those certain dies does not result in defects.

In an embodiment a speed limit is applied to stepping movements for target dies in an area near the edge of the substrate W. Limiting stepping speed is advantageous because one or more bubbles may be removed or prevented. It prevents or substantially reduces the risk of losing liquid and thereby allowing a bubble to form.

By limiting scan and/or stepping speeds and having a manual speed limiter for certain dies, the number of bubbles formed during the imaging of a substrate W may be reduced to having five to one bubble for every substrate W imaged or fewer. The range may be expressed as 5 to 0 bubble per substrate W, desirably 0 to 1 bubbles per substrate and most desirably 0 to 0.5 bubbles per substrate W.

In the following description, the surface of the substrate W may be considered to be coated with a top-coatless resist or a topcoat such as TCX041 top coat by JSR Corporation. The reference to scanning or imaging motion is intended to refer to exposure scans on product images. It is not intended to refer to other moves, for example alignment scans. It is desirable that the co-ordinate system considered for the model and the manual override is a substrate W co-ordinate system rather than the substrate table WT co-ordinate system. However, the latter can be used. By speed, the magnitude of the velocity vector is meant.

Figure 7:
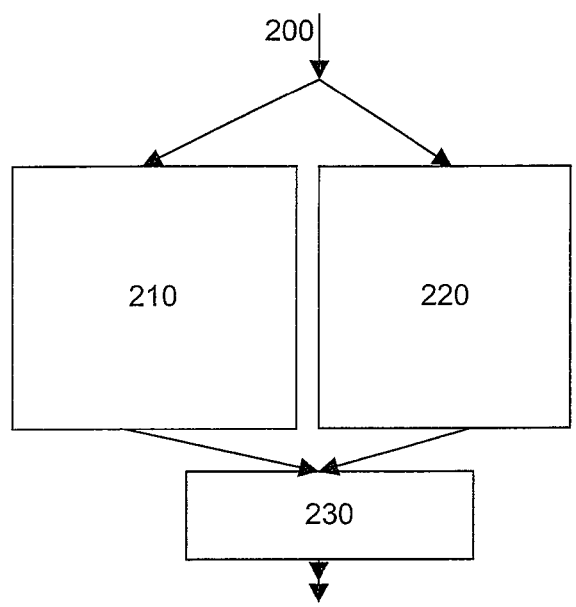
FIG. 7 is a flow diagram of the process for selecting scan and/or step speed according to an embodiment of the invention.

The steps in the logic process are illustrated in the flow diagram of FIG. 7. The scan co-ordinates and machine location is input at 200 and used by a model 210 and a manual override 220 in parallel. The scan and/or step speeds determined by each of the model 210 and the manual override 220 are then selected from by a speed selector 230. The selected speed for scanning and/or stepping is applied in the lithographic apparatus by the controller 50.

Therefore the controller 50 may control the positioning system PW which is configured to determine the relative position of the substrate W, or the substrate table WT, or both, relative to the liquid confinement structure 12 of the projection system PS or both. In an embodiment, the controller 50 adjusts one or more operating conditions of the apparatus during motion of the substrate and/or substrate table relative to the liquid handling system and/or projection system when a predetermined area of the substrate, and/or substrate table is under the liquid handling system. In particular, the controller 50 adjusts the one or more operating conditions during movement of a substrate under the liquid handling system, for example during imaging motion and/or during stepping motion.

In one embodiment, adjustment takes place if the imaging motion of a die is (at least partly) within a first predefined area. The controller may additionally or alternatively adjust one or more operating conditions during stepping between adjacent dies. The adjustment may take place if the stepping occurs (at least partly) within a second predefined area.

The first and second predefined areas may be the same or they may be different. They may be defined as described below. In one embodiment the areas are defined by defining an area between two ellipses. The first predefined area and/or the second predefined area may be at or near the edge of the substrate.

The controller may additionally require a further condition to be met in order to adjust the one or more operating conditions even if the imaging or stepping occurs within one of the first and second predefined areas. For example, a precondition for adjusting an operating condition during imaging may be that the imaging movement is towards the X axis of the substrate W and not away from the X axis of the substrate W. This may be advantageous because scans onto a substrate W or just on a substrate W may tend to result in more defects than scans off a substrate W or moving closer to the edge of a substrate W.

In an embodiment an alternative or additional further condition may be that the motion of the pre-defined area relative to the liquid handling structure is in a direction so in a frame of reference of the liquid handling structure an edge of the substrate moves away from the liquid handling structure.

In an embodiment an alternative or additional condition is that in the frame of reference of the substrate table a path of the fluid handling structure in the direction of motion between the substrate table and the fluid handling structure is part of a line across the substrate. A pre-defined area is not more than half the length of the line away from the edge of the substrate which in the frame of reference of the fluid handling structure is moving away from the fluid handling structure.

In the frame of reference of the liquid handling structure, the substrate moves under the fluid handling substrate. However, relative to the substrate and in the frame of reference of the substrate, the fluid handling structure follows a path across the substrate (i.e. a line of dies for example). The path may not be straight; so at a moment in time, the path may be aligned with a line across the substrate, which may be straight. As the line crosses the substrate, it has two halves: a half in which in the frame of reference of the substrate, the liquid handling structure moves towards the center of the substrate; and a half in which the liquid handling structure moves away from the center of the substrate. In the half in which the liquid handling structure moves towards the center of the substrate, the liquid confinement structure moves away from an edge of the substrate; so in the frame of reference of the liquid handling structure, the edge moves away from the liquid handling structure. In this description, reference to moving towards or away from the center of a substrate does not necessarily mean that in the frame of reference of the substrate that the liquid handling structure is moving directly towards or away from the center of the substrate. It may mean that the liquid confinement structure moves with a component of its direction of movement directed away from or towards the center.

In an embodiment an alternative or additional further condition may be the size of the so-called extension length M. The extension length M is the maximum distance in the Y direction between the start of a scan and the position in the Y direction during a step between lines of dies (as explained in relation to FIG. 9 below).

An additional or alternative further condition is that the imaging or stepping occurs within an angular range relative to the X and Y directions from the centre of the substrate W.

An additional or alternative further condition is that the length (e.g. based on the distance from the end of the last die exposure to the start of the next die exposure) of the motion (e.g. stroke length) falls within a defined range. In particular, the condition is that the length of the motion is greater than a certain value. Long strokes are more likely to lead to bubble formation. Therefore the algorithm can change an operating condition for large movements, for example by reducing speed. Long strokes occur between imaging rows, particularly in the angular range of −45 to +45° from the X axis. Therefore an alternative or additional further condition could be that the movement is at the end of rows in that angular range.

An additional or alternative further condition, in the frame of reference of a feature which is elongate in plan, is the angle between the elongate feature over which the liquid handling structure 12 passes and the direction of travel of the liquid handling structure 12 relative to the feature. That is, in the frame of reference of the liquid handling structure, the corresponding angle is the angle between the elongate feature which passes under the liquid handling structure 12 and the direction of travel of the feature relative to the liquid handling structure 12. In one embodiment the elongate feature is a gap between an object on the substrate table and the edge of the substrate table WT adjacent to the object. In one embodiment the object is the substrate W. There may be a relationship between this angle (or the corresponding angle in the frame of reference of the liquid handling structure 12) and the likelihood of a droplet forming. Alternatively or additionally the further condition may be the angle between the elongate feature and the meniscus which extends between the liquid handling system 12 and the substrate W and/or substrate table WT.

An additional or alternative further condition is that a physical property of the substrate W falls within a defined range. One or more process parameters can have an effect on the speed at which a bubble forms. Process parameters include, for example, resist, topcoat and substrate edge definition. The substrate edge definition means the width of the top edge of a substrate W from which the topcoat has been removed and the static contact angle of immersion liquid to the newly exposed surface. The newly exposed surface can comprise BARC, an adhesion layer (for example HMDS), Si, $SiO_2$, metal, etc.

An additional or alternative further condition is whether the position of dies on the substrate W fall within a defined area.

The magnitude of the adjustment made by the controller 50 may depend upon one or more of the further conditions and/or on the precise position within the defined area.

Some specific embodiments are described below. One or more features of one embodiment may be combined with one or more features of any other embodiment.

The specifications of specific embodiments of the model 210, the manual override 220 and a minimum speed selector are discussed in the following paragraphs.

Figure 8:
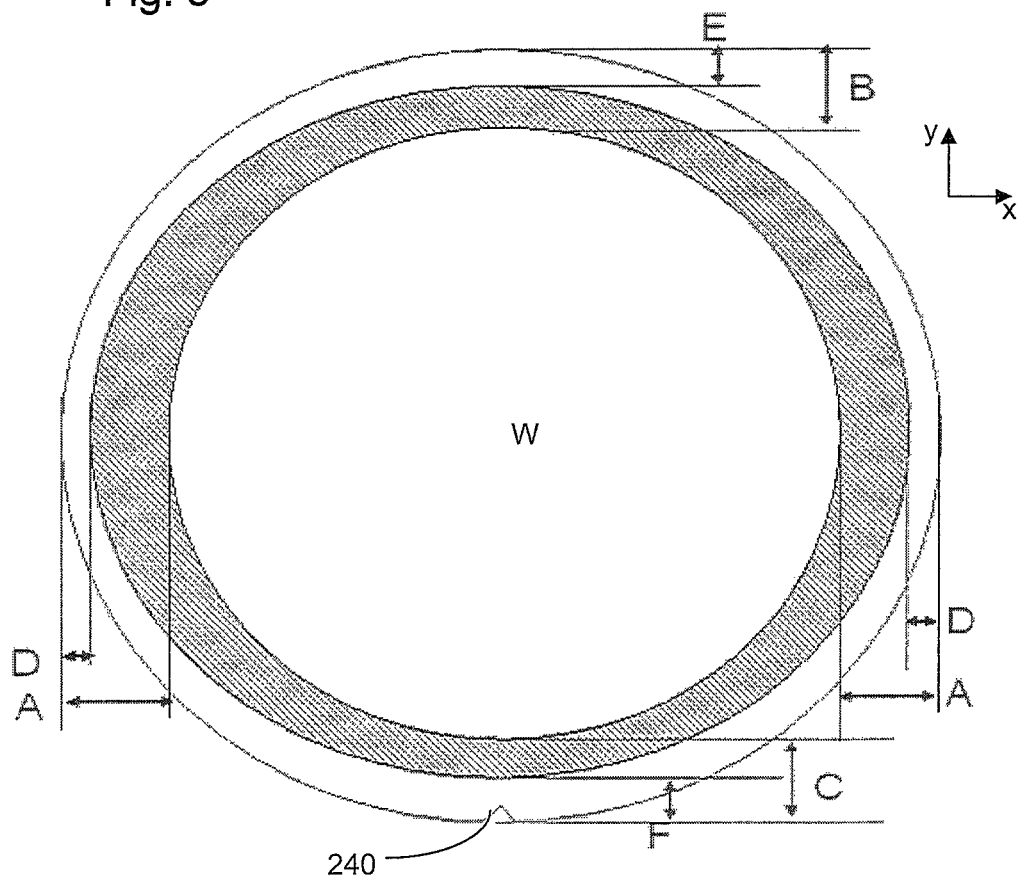
FIG. 8 is a representation of the area of a substrate to which scan speed reduction may be applied according to an embodiment of the invention.

To determine whether a scan must be slowed down according to the model 210, an area on the substrate W is defined as shown as cross-hatching in FIG. 8. Values for parameters A, B, C, D, E and F are shown in Table 1. The parameters may be referred to in terms of machine constants.

TABLE 1

Default values for parameters A, B, C, D, E and F

| Parameter | Preferred ranges (mm) | Allowed range (mm) |
|---|---|---|
| A | 30-50, desirably 40 | 0-150 |
| B | 15-25, desirably 20 | 0-150 |
| C | 15-25, desirably 20 | 0-150 |
| D | −1000 (i.e. the edge of the substrate) | −1000 - [value A] |
| E | −1000 | −1000 - [value B] |
| F | −1000 | −1000 - [value C] |

Note that four positions are chosen for these parameters. The positions may be selected to be on the major and minor axes in the plane of the substrate W. One position may be the position of a positioning notch 240 defined in the edge of the substrate W (C, F). A position may be on the second intersection of a first axis passing through the notch with the edge (e.g. at a position substantially opposite the notch) (E, B). The other two positions may be on the other of the major and minor axes, desirably along a perpendicular to the second axis (A, D).

The measurements at the four positions define an inner ellipse and an outer ellipse. In the embodiment indicated in Table 1 above, the outer ellipse corresponds to the edge of the substrate W. The two ellipses define an area near the edge of the substrate W.

The following rule determines that a scan must be done at an alternative (lower) velocity:
1. If the begin point of a scan or the end point of a scan (or both) are in the shaded part of FIG. 8, AND the further condition.
2. If the scan is NOT directed outwards from center towards or over the edge by evaluating the start and end position: the definition of "a scan is directed outwards" is as follows
   a. for an up-scan if the y-coordinate of the start position is positive
   b. for a down-scan if the y-coordinate of the start position is negative (the center of the substrate W being the origin)

Thus the following rule determines that a scan is not carried out at the alternative (lower) velocity:
1. If the begin point of a scan or the end point of a scan (or both) are in the shaded part of FIG. 8, AND the further condition.
2. If the scan is directed inwards from center towards or over the edge by evaluating the start and end position: the definition of "a scan is directed inwards" as follows
   c. for an up-scan if the y-coordinate of the start position is negative.
   d. for a down-scan if the y-coordinate of the start position is positive (the center of the substrate W being the origin)

Therefore the rule applies if the starting point, the ending point or both is in an area of the substrate surface W defined by the shaded area (i.e. the ring) and the scan is in an inwards direction, the scan is at the speed of the alternative scan speed.

In an embodiment the value of the alternative scan speed may be set to be constant. The default value and allowed range for different allowed scan speed ranges is listed in Table 2.

TABLE 2

Default values for alternative scan speeds

| Parameter | Desired default value (mm/s) | Default range value (mm/s) | Allowed range (mm/s) |
|---|---|---|---|
| Alternative scan speed | 350 | 250-400 | 0-500 |
| | 400 | 300-450 | 0-600 |
| | 500 | 350-550 | 0-750 |
| | 550 | 400-650 | 0-800 |
| | 600 | 450-800 | 0-900 |
| | 700 | 500-850 | 0-1000 |

Figure 9:
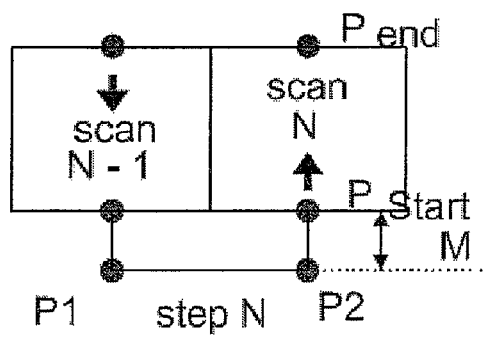
FIG. 9 illustrates a step displacement vector.

In an embodiment, to determine whether a step shall be slowed down, a vector of displacement for the step is evaluated. The start- and end-coordinate of the displacement vector P1→P2 is defined by parameters as shown in FIG. 9.

Figure 10:
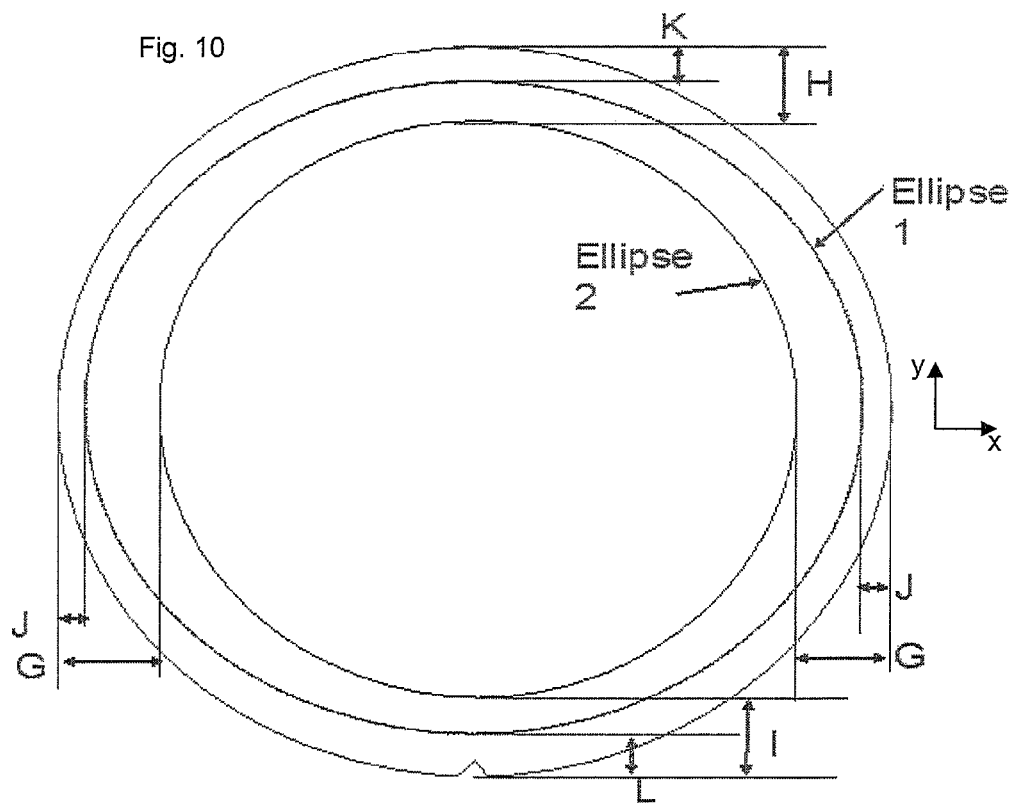
FIG. 10 is a schematic representation of the geometric parameters for step speed reduction according to an embodiment of the invention.

A geometrical pattern relative to the edge of the substrate W is used to define when speed reduction may be applied to a step between two dies. The geometrical pattern comprises two ellipses which are shown in FIG. 10.

Parameters G, H, I, J, K, L and M are defined. Their values may be predetermined and set as machine constants. Default values and suitable ranges are provided in Table 3.

TABLE 3

Default values for parameters G, H, I, J, K, L and M

| Parameter | Range (mm) | Desired value (mm) | Allowed range (mm) |
|---|---|---|---|
| G | 40-60 | 50 | 0-150 |
| H | 10-20 | 15 | 0-150 |
| I | 10-20 | 15 | 0-150 |
| J | 40-50 | 50 | 0-150 |

TABLE 3-continued

Default values for parameters G, H, I, J, K, L and M

| Parameter | Range (mm) | Desired value (mm) | Allowed range (mm) |
|---|---|---|---|
| K | 10-20 | 15 | 0-150 |
| L | 1-20 | 15 | 0-150 |
| M | 5-15 | 11 | 0-50 |

The allowed range for each of parameters G to L correspond to a radial dimension of the substrate W.

Parameter M, as shown in FIG. 9, is a dimension used to characterize the settle time to allow for acceleration and accurate positioning during a change of direction of motion. Parameter M is the distance between the position at the start or end of a scan (imaging motion) and the furthest position in the direction of imaging (the y direction) during an adjacent stepping motion (step N in FIG. 9). Parameter M is adjusted such that the substrate table WT thus maintains a constant velocity time period so that all servos controlled to move the substrate table WT are within required limitations of accuracy.

In an embodiment, only steps followed by an up-scan are slowed down by default. (In Cartesian coordinates, an up-scan corresponds to a positive movement along the y-axis away from the x-axis for all target positions on the substrate W). In an embodiment lines of dies may be imaged along the axis and the lines of dies are imaged successively downwardly.

A Boolean parameter U is defined to determine when a limited speed may be applied. If the value of the parameter is TRUE, only a step (matching certain criteria) which is followed by an up-scan is at a reduced speed. If the value of the parameter is FALSE, all steps matching the certain geometric criteria (i.e. of the ellipses) are carried out at a reduced speed.

The speed of the step N shall be reduced to the alternative (reduced) step speed, If:

10 P1 is outside ellipse 1, AND
11 P2 is inside ellipse 2, AND
12 IF U is TRUE THEN
    IF scan N is an up-scan In Table 4, the default value for parameter U and the default alternative step speed are specified for different allowed ranges:

TABLE 4

Parameter U and alternative step speed

| Parameter | Selected value [mm/s] | Possible Range for Selected Value [mm/s] | Allowed range [mm/s] |
|---|---|---|---|
| U | TRUE | TRUE | TRUE/FALSE |
| Alternative step speed | 250 | 200-400 | 0-500 |
| | 300 | 250-500 | 0-600 |
| | 350 | 300-650 | 0-750 |
| | 400 | 350-700 | 0-800 |
| | 450 | 400-800 | 0-900 |
| | 500 | 450-900 | 0-1000 |

In the described embodiment, the reduced speed is applied under certain circumstances when the scan is an up-scan. In an embodiment, the reduced speed may be applied when the scan is up-scan or a down-scan.

The amount of liquid lost when crossing the edge of a substrate W may be dependent on the static receding contact angle of the surface of the substrate W, e.g. the surface of the resist or topcoat. One such topcoat is TCX041 which has a static receding contact angle of about 66 degrees. As liquid may be lost from the immersion space 11 depending on the static receding contact angle and the relative speed of the surface relative to the liquid confinement structure, the model may be optimized for this parameter.

A surface with a greater static receding contact angle may lose less liquid during edge crossing, and even in general. For the same liquid loss, the reduction in speed may be less. The dimensions of the geometric parameters for the model may be adjusted to reduce the number of targets for which a reduced speed is used for scanning and stepping. The model may be optimized for the static receding contact angle of the surface. In this way, the area over which a reduced speed is used may be reduced. The duration of reduced speed is thus less. The throughput may increase. It may be desirable to use a surface coating with a higher static receding contact angle, for example AIM 5484. As a consequence, the change of speed may occur closer to the edge of the substrate W. The controller 50 may incorporate the control system disclosed in the U.S. patent application no. U.S. 61/136,943 filed on 16 Oct. 2008, which is hereby incorporated by reference in its entirety.

A manual override 220 may be present. The manual override 220 may be used to adjust the speed of the substrate table WT relative to the projection system PS, for example for a particular scan or step motion associated with a particular die. The manual override 220 may be used if the model 210 does not apply an appropriate speed during a step or scan movement to increase the formation of a bubble. Manual override may be implemented as a machine constant.

In an embodiment, a recipe-based manual override 220 may not be available. Although this would require a target area to be scanned at the same speed whatever the layer and this could reduce throughput, the complexity of the system would be less.

In an embodiment, a recipe-based manual override 220 may apply. Different layers (with different static receding contact angles) will require adjustment of the model 210 to suit the particular layer on the surface being processed, e.g. imaged. The manual override 220 may allow details about a surface property (e.g. static receding contact angle) to be used to adjust the model 210 so that different areas would be scanned or stepped at the reduced (alternative) speed. Thus the same area could have different layers scanned at the standard speed or at the reduced speed. This may allow optimization of scan and/or step speed depending on a surface property of the surface layer. Throughput may be improved.

The manual override 220 enables a user to define a number of override areas, for example a maximum of 10. Each override area is defined by a center co-ordinate (X1 and Y1, relative to a substrate center), a length DX in the direction of the x-axis and a length DY in the direction of the y-axis. This is shown in FIG. 11.

The override area covers a number of dies. Associated with each die is a black dot. The dot may represent the scan start- and end-coordinate position for that die. If the start and end position is in the override area then the reduced (alternative) scan and/or step speed is used as described previously. Thus only if both the start- AND end-coordinates are within the override area is the alternative scan and/or step speed activated.

Figure 11:
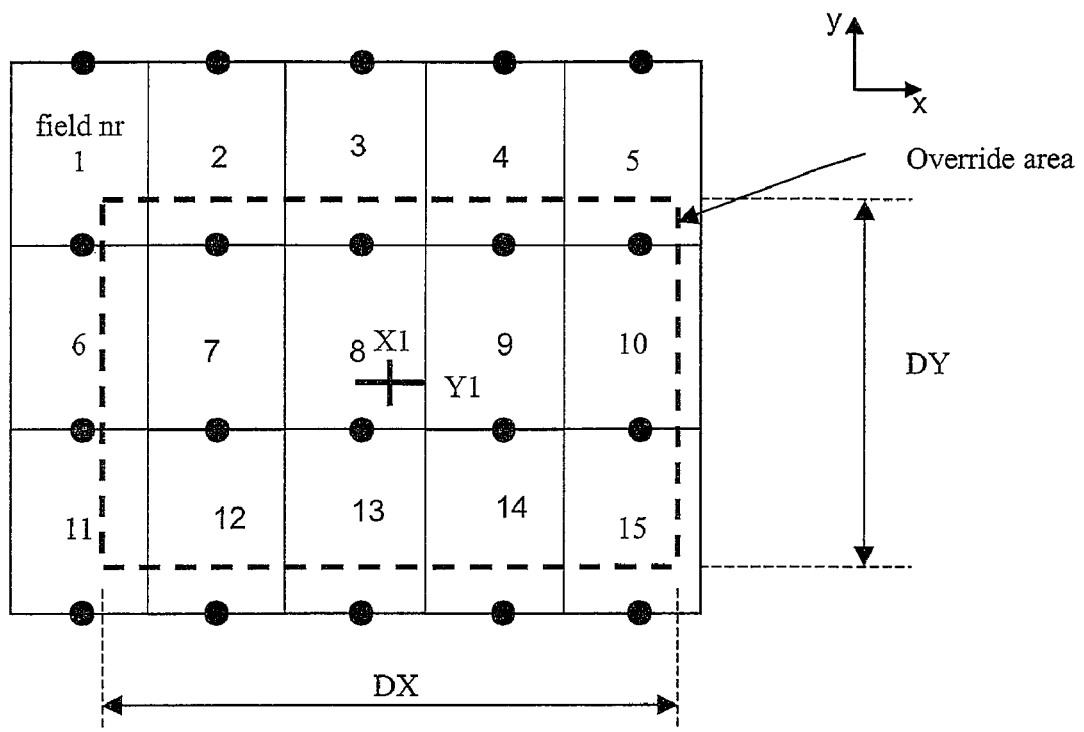
FIG. 11 is a schematic representation of a definition of an override area according to an embodiment of the invention.

In the example shown in FIG. 11, only dies 7, 8, 9 and 10 are affected by the override area. If a step speed is specified in the override machine constants, it is applied to the preparatory phase of the affected dies. So in the example of FIG. 10, the step between dies 6 and 7, 7 and 8, 8 and 9 and 9 and 10 are slowed down, but control of the step between dies 10 and 11, 4 and 5, and 5 and 6 are not affected by the manual override module.

A user may wish to enter machine constants according to the values for each die selected. The values include the override section, the coordinates of the center of the override area (center X1 and center Y1), the dimensions of the override area (DY and DX) and the maximum scan speed and/or the maximum step speed for the override area.

The model 210 delivers a scan and/or step speed for each of the areas (scans) to which the model is applied. The manual override 220 module provides a speed for a number of scans and/or steps; these scans and/or steps may be predetermined. In an embodiment the manual override 220 may only be capable of slowing down scan and/or step speed for specific target dies. The manual override may slow down the scan and/or step speed for a die for which the scan or step speed is not favorably adjusted by the model 210. Therefore, a rule needs to determine whether the scan and/or step speed should be applied. That is the speed applied should be selected from the speed determined by the model 210 or the manual override 220. The speed is selected by the speed selector.

In an embodiment the manual override 220 module trumps the output of the model 210 in the event of disagreement. However, in an embodiment the scan speed could be determined as an application scan speed (which is a substrate table WT machine constant). An application speed is a user defined speed which may be predetermined and is not freely chosen. The application speed may be pre-selected before operation. A manual override may be set to any value that the user chooses to select. A manual override may be set during use. So there may be conflict between the application speed (which the user pre-selected before use) and the manual override (which may be selected during use). If the application scan (and/or step) speed is lower than a value determined by the model 210 or the manual override 220, then the maximum speed is equal to the application scan speed. The application speed selection may be an additional safety measure to ensure that the manual override does not set a speed which is in excess of an acceptable speed setting. Beside the model 210, the application speed and the override module 220, there may be other criteria which may be used to determine the maximum scan (and/or step) speed.

In an embodiment, the speed selector would select the maximum scan/step speed from the lowest value of: the application scan/step speed; the speed determined by the model 210 or the manual override 220; and/or other criteria. This speed selector configuration may be useful for diagnostic purposes and for servicing and throughput. This is because it allows the manual override 220 to increase the speed as compared to that determined by the model 210.

TABLE 5

Examples of speed selector decisions

| Example | Determined by the model (mm/s) | Manual override module (mm/s) | Application scan speed (mm/s) | Other criteria (mm/s) | Speed selector final speed (mm/s) |
|---|---|---|---|---|---|
| 1 | 600 | 450 | 500 | 600 | 450 |
| 2 | 400 | 600 | 700 | 650 | 600 |
| 3 | 400 | 650 | 500 | 600 | 500 |
| 4 | 700 | 450 | 900 | 400 | 400 |
| 9 | 500 | n/a | 550 | 700 | 500 |

In an embodiment, the selected speed selects the speed determined by the model 210 and the manual override 220 from the group of selection options as a whole: the application scan/step speed; the speed determined by the model 210; the speed determined by the manual override 220; and/or other criteria.

The speed selected for a scan or step movement at a target die may be logged in a memory.

In a variation of the model 210, the scan speed is reduced for each target die which is partially or completely outside a predefined periphery (e.g., perimeter) at a fixed radial distance from the edge of the substrate W. In an embodiment, the predefined periphery is 100 mm from the edge of the substrate W. The predefined periphery may be 0 to 12 mm, desirably 5 to 100 mm. The reduced scan velocity may be 400 mm/s for, for example, a surface coating of TCX041.

Figure 12:
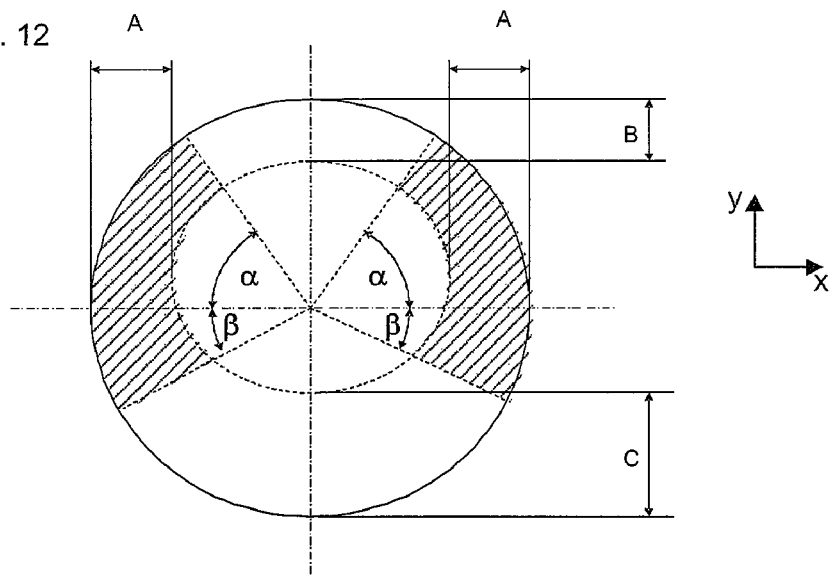
FIG. 12 illustrates a perimeter scan speed reduction according to an embodiment of the invention.

In a variation, the predefined periphery is an ellipse as shown in FIG. 12. A is dimension of the periphery area along the x axis relative to the center of the substrate W. B is a dimension of the periphery area along the y axis in a radial direction away in a positive direction from the center of the substrate W. C is a dimension of the periphery area along the y axis away in the radial direction away from the center of the substrate W. Suitable values could be 40 to 50 mm, for example 45 mm for A, 30 to 35 mm, for example 33 mm for B and 50 to 60 mm, for example 55 mm for C. These are dimensions for a 300 mm diameter substrate. The dimensions may be altered proportionately according to the substrate W size used.

In a variation, the limited scanning speed may be applied to those target die for which scanning occurs onto the substrate W surface. Such a target die with positive y coordinates relative to the center of the substrate W would have a limited scan speed if the scan direction is downwards. A target die with negative y coordinates would have a limited scan speed if the scan direction is upwards.

In a variation, the periphery area is separated into two segments as shown by the cross-hatched areas in FIG. 12. The segments may be treated for further throughput improvements. The segments are determined by two angles: alpha and beta. Alpha corresponds to the angular displacement of the segment above the x axis (i.e. relative to the center of the substrate). Beta corresponds to the angular displacement of the segment below the x axis. Alpha may be in the range of 40 to 80° and beta in the range 20 to 80°, for example. Additionally or alternatively a smooth transition in adjustment of operating conditions can take place in the area between the two segments.

As described herein, the chance of escaping liquid may increase when an edge of a substrate W moves under the liquid confinement structure 12. A particular circumstance can arise in a liquid confinement structure 12 which comprises a liquid retrieval feature radially inwardly of a gas knife such as described in US 2008-0212046 and US 2009-0262318. In such a structure any liquid which has passed the liquid retrieval feature (the single or two phase extractor or the extraction holes of the gas drag principle arrangement) can be trapped as one or more escaped droplets radially inwardly of the gas knife. Further movement of the substrate W in a direction in which the position of the escaped droplet on the substrate W moves towards or under the gas knife results in the droplet being blocked by, and therefore retained along, the gas knife between the gas knife and the liquid retrieval feature. On a change in direction of movement of the substrate W relative to the liquid confinement structure 12 a droplet trapped by the gas knife can move towards the liquid retrieval feature. At this position the droplet can interact, for example collide, with the meniscus of liquid extending between the substrate and the liquid confinement structure 12. This may induce a bubble of gas in the liquid in the space.

In particular this may induce a sticking bubble whose position is fixed on the substrate W. If such a sticking bubble is positioned under an exposure area, e.g. under the exposure slit, of the next die to be imaged an imaging error can result.

Figure 13:
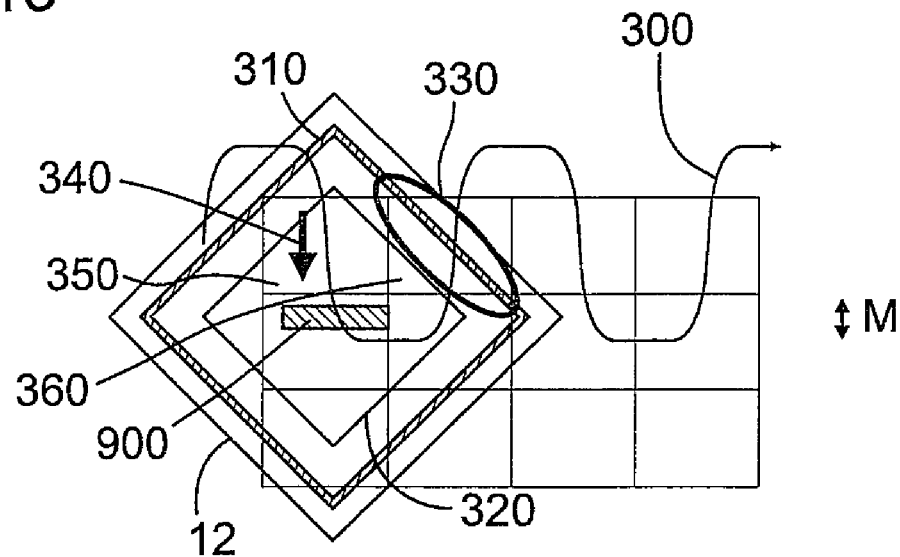
FIG. 13 is a schematic representation of the movement of a substrate under a liquid supply system and the source of imaging errors.

FIG. 13 shows the mechanism in more detail. A meander path 300 of the substrate W under the liquid confinement structure 12 is illustrated. In an embodiment, the liquid confinement structure 12 has, in plan, a square shape with corners. The corners may be aligned, in use, with the step and scan directions. The liquid confinement structure may, in plan, have any shape. In an embodiment, the gas knife 310 is positioned radially outwardly of a liquid retrieval feature 320.

Figure 14:
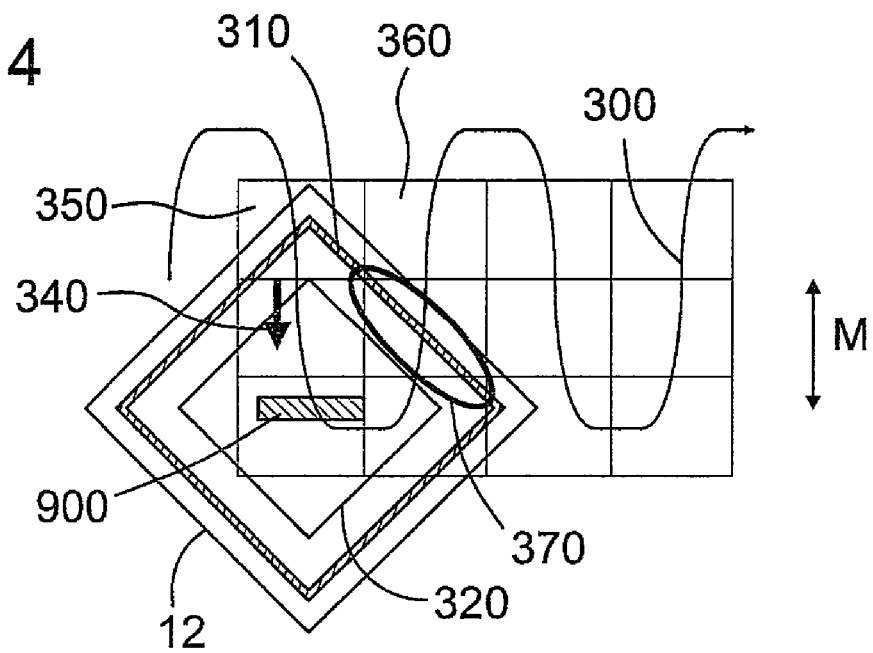
FIG. 14 is a schematic representation of the movement of a substrate under a liquid supply system to avoid a source of imaging errors, for example that illustrated in FIG. 13.

An exposure slit 900 is illustrated in FIGS. 13 and 14. The exposure slit 900 is the area which is exposed by the patterned beam from the projection system PS. If a droplet is trapped between the liquid retrieval feature 320 and the gas knife 310, for example due to passing over the edge of the substrate W, liquid may escape to the area between the liquid retrieval feature 320 and the gas knife 310. Any such liquid will be in the form of one or more droplets and be trapped by the gas knife 310 in the area 330.

When the scan in the direction illustrated by arrow 340 to over a first die 350 is complete, the direction of the substrate W under the liquid confinement structure 12 changes, for example as a meander path illustrated by arrow 300. As can be seen, the area 330 of the collection of a droplet is over, e.g. directly over, the position which the exposure slit 900 will take up during imaging of the subsequent die 360 to be imaged. In an embodiment the subsequent die is next to the first die 350. Thus, it may be likely that the droplet will collide with the meniscus of liquid extending between the substrate W and the liquid retrieval feature 320. Such a collision could thereby create one or more bubbles in the liquid. The bubbles are likely to be sticking bubbles and be positioned under the exposure slit 900 during imaging scanning of the subsequent die 360 to be imaged. The creation of such a bubble may increase the risk of an imaging defect.

Whether a bubble will exist in the exposure slit 900 during imaging of a subsequent die can be approximated by the following equations:

$$SSA \cong \frac{1}{2} \cdot \frac{v^2}{a} + v \cdot \tau + \frac{Y_{slit}}{2}$$

$$y = \frac{D_{AK}}{2} - SSA \pm \Delta y$$

SSA Length of step, settle and acceleration move in scanning direction
v Scan speed in the scanning direction
α Stage acceleration in the scanning direction
τ Settle time after acceleration
$Y_{slit}$ Width of the exposure slit (determined by 95% intensity profile)
$D_{AK}$ Diameter of the gas knife
Δy Spread of bubbles
y Position of the droplet in the field This mechanism likely only affects a few dies on the whole of a substrate W.

Therefore, according to an embodiment of the invention, the controller 50 can adjust one or more operating conditions during movement of the substrate W under the liquid confinement structure 12 at the locations on the substrate W where this effect occurs. An operating condition which can be varied is parameter M as shown in FIG. 9. A way of achieving this is illustrated in FIG. 14. In FIG. 14 it can be seen that parameter M is increased so that the down scan prior to the next die is elongated. Thus, the controller 50 may vary the operating condition of the apparatus which is the distance between the position at the start or end of a scan (scanning imaging motion) and the furthest position in the direction of imaging (the y direction) during an adjacent stepping motion prior to a subsequent scanning imaging motion over a subsequent die 360 (i.e. parameter M shown in FIG. 9). As illustrated, a sticking bubble is created in a different die (in area 370) and is outside of the exposure area of the subsequent die 360 to be imaged. Therefore, the chance of defects caused by sticking bubbles during imaging of the subsequent die 360 is reduced.

The extra distance which the substrate W has to travel may be approximately two times the scan length. For a scan length of 26 mm and a scan speed of 750 mm/s the extra scan time amounts to approximately 69 ms per affected die. If the critical dies are limited to fewer than 10 per substrate W, the loss in throughput would be 0.69 s per substrate W or less. For a throughput of about 150 substrates W per hour, a 3% loss in throughput would result.

The above description refers to a "die". This description could alternatively refer to an exposure field. An exposure field could include several dies. A die is typically one customer product.

As will be appreciated, any of the above described features can be used with any other feature and it is not only those combinations explicitly described which are covered in this application.

In an embodiment there is provided an immersion lithographic apparatus comprising: a substrate table, a projection system, a liquid handling system and a controller. The substrate table is configured to support a substrate. The projection system is configured to direct a patterned beam of radiation onto a substrate. The liquid handling system is configured to supply and confine immersion liquid to a space defined between a projection system and a substrate, or the substrate table, or both. The controller is configured to adjust at least one operating condition of the apparatus during motion of a substrate and/or substrate table relative to the liquid handling system when a predefined area of the substrate and/or substrate table is under the liquid handling system.

The controller may be configured to adjust at least one operating condition of the apparatus during an imaging motion of a die at least partly within a first predefined area or to adjust at least one operating condition of the apparatus during a stepping motion between adjacent dies at least partly within a second predefined area, or both. The first and/or second predefined area may be at or near an edge of the substrate.

The predefined area may be defined by an ellipse, desirably at least two ellipses. The at least one operating condition may be one or more selected from the group comprising: relative speed of motion between the substrate, or the substrate table, or both, and the liquid handling system, or the projection system, or both; distance between a bottom surface of the liquid handling system and the top surface of the substrate, or the substrate table, or both; flow-rate of immersion fluid supplied to the space; level of an under pressure source that is used to extract immersion liquid; gas flow-rate used in a gas knife of the liquid handling system; angle of a lower surface of the liquid handling system relative to the surface of the substrate; fluid flow-rate of liquid out of an opening in an under surface of the liquid handling system; variation in fluid flow rate into or out of openings dependent upon their angular position relative to the direction of motion; or variation in the distance between the position of the liquid handling system relative to the substrate at the start or end of a scanning imaging motion and the furthest position in the direction of scanning imaging motion of the liquid handling system relative to the substrate prior to a subsequent scanning imaging motion.

The at least one operating condition may comprise at least one operating condition of the liquid handling system. The at least one operating condition of the liquid handling system may be one or more selected from the group comprising: fluid flow rate through an opening of the liquid handling system; orientation of the liquid handling system relative to the projection system and/or substrate and/or substrate table; or distance between the liquid handling system relative to the projection system and/or substrate and/or substrate table.

The at least one operating condition may comprise at least one operating condition of a positioning system configured to position a substrate, or the substrate table, or both relative to the liquid handling system, or the projection system, or both. The at least one operating condition of the positioning system may be one or more selected from the group comprising: relative speed of motion between the substrate, or the substrate table, or both and the liquid handling structure, or the projection system, or both; angle of a lower surface of the liquid handling system relative to the surface of the substrate; or distance between a bottom surface of the liquid handling system and the top surface of the substrate, or the substrate table, or both.

The controller may be configured to adjust the at least one operating condition only when a further condition is met. The further condition may be that an imaging motion is towards an axis of symmetry of the substrate which is perpendicular to the direction of imaging and in the plane of the top surface of the substrate. The at least one operating condition may be adjusted during a scanning motion. The further condition may be that a distance between the position at the start or end of an imaging motion and the furthest position in the direction of imaging during an adjacent stepping motion falls within a defined range. The at least one operating condition may be adjusted during a stepping motion. The further condition may be that an imaging motion and/or stepping motion is within a certain angular range from a central position of the substrate. The further condition may be that an angle, in plan, between an elongate feature which passes underneath the liquid handling system and the direction of motion of the elongate feature falls within a defined range. The further condition may be that a physical property of the substrate falls within a defined range. The physical property may be at one or more selected from the group comprising: static contact angle of immersion liquid with a top outer edge surface of the substrate; width of a top outer edge surface of the substrate; static contact angle of immersion liquid with an exposed resist, topcoat, BARC, adhesion layer, Si, $SiO_2$ or metal of the top outer edge of the substrate; width of exposed resist, topcoat, BARC, adhesive layer, Si, $SiO_2$ or metal.

The further condition may be that the locations of dies on the substrate fall within a defined area. The further condition may be that a length of a motion between the end of one die and the start of the next die is greater than a defined value.

The immersion lithographic apparatus may further comprise a manual override to allow a user to override the controller. The manual override may allow overriding of adjustment of the at least one operating condition by the controller in a user defined third predefined area and sets the at least one operating condition to a user defined value.

Motion of the predefined area relative to the liquid handling structure may be in a direction so that an edge of the substrate moves away from the liquid handling structure. A path of the fluid handling structure, in the frame of reference of the substrate table, over the substrate during relative motion between the substrate table and the fluid handling structure may be part of a line across the substrate, and the predefined area is not more than half the length of the line away from the edge which, in the frame of reference of the fluid handling structure, may be moving away from the fluid handling structure.

In an embodiment there is provided a method of operating a lithographic apparatus, the method comprising: moving and adjusting. In the moving, a substrate table supporting a substrate is moved relative to a projection system configured to project a patterned beam of radiation through immersion liquid confined by a liquid handling system onto a substrate. In the adjusting, at least one operating condition of the apparatus is adjusted during motion of the substrate and/or substrate table relative to the liquid handling system when a predefined area of the substrate and/or substrate table is under the liquid handling system.

The adjusting of the at least one operating condition of the apparatus may be: during an imaging motion of a die at least partly within a first predefined area; or during a stepping motion between adjacent dies at least partly within a second predefined area; or both. The first and/or second predefined area may be at or near an edge of the substrate.

The predefined area may be defined by an ellipse, desirably at least two ellipses. The at least one operating condition may be one or more selected from the group comprising: relative speed of motion between the substrate, or the substrate table, or both, and the liquid handling system, or the projection system, or both; distance between a bottom surface of the liquid handling system and the top surface of the substrate, or the substrate table, or both; flow-rate of immersion fluid supplied to the space; level of an under pressure source that is used to extract immersion liquid; gas flow-rate used in a gas knife of the liquid handling system; angle of a lower surface of the liquid handling system relative to the surface of the substrate; fluid flow-rate of liquid out of an opening in an under surface of the liquid handling system; or variation in fluid flow rate into or out of openings dependent upon their angular position relative to the direction of motion. The at least one operating condition may comprise at least one operating condition of the liquid handling system.

The at least one operating condition may comprise at least one operating condition of a positioning system configured to position a substrate, or the substrate table, or both relative to the liquid handling system, or the projection system, or both. The adjusting of the at least one operating condition may be only when a further condition is met.

In an embodiment there is provided an immersion lithographic apparatus comprising: a substrate table, a projection system, a liquid handling system, a positioning system, and a controller. The substrate table is configured to support a substrate. The projection system is configured to direct a patterned beam of radiation on to a substrate. The liquid handling system is configured to supply and confine immersion liquid to a space defined between the projection system and the substrate, or the substrate table, or both. The positioning system is configured to determine the relative position of the substrate, or the substrate table, or both, relative to the liquid handling structure, or the projection system, or both. The controller is constructed and arranged to control relative motion between the substrate, or the substrate table, or both, and the liquid handling structure, or the projection system, or both. The controller is configured to lower: the scanning speed between the substrate table and the projection system during imaging of a target within a predefined area at or near an edge of the substrate, or the stepping speed between adjacent target positions in a predefined area at or near the edge of the substrate, or both.

The lithographic apparatus may comprise a manual control to predetermine the scanning speed during imaging of a selected target, or the stepping speed between selected adjacent targets, or both. Motion of the predefined area relative to the liquid handling structure may be in a direction so that an edge of the substrate moves away from the liquid handling structure. A path of the liquid handling structure over the substrate during relative motion between the substrate table and the fluid handing structure, in a frame of reference of the substrate table, may be part of a line across the substrate. The predefined area may be not more than half the length of the line away from the edge which in a frame of reference of the liquid handling structure is moving away from the liquid handling structure.

In an embodiment there is provided a method of operating a lithographic apparatus, the method comprising: moving and lowering. In the moving, a substrate table supporting a substrate is moved relative to a projection system configured to project a patterned beam of radiation on to a target portion of the substrate. In the lowering, the scanning speed between the substrate table and the projection system is lowered during imaging of a target within a predefined area at or near an edge of the substrate, or the stepping speed is lowered between adjacent target positions in a predefined area at or near the edge of the substrate, or both.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus comprising:
   a substrate table configured to support a substrate;
   a projection system configured to direct a patterned beam of radiation onto the substrate;
   a liquid handling system, above the substrate table, configured to supply and confine immersion liquid to a space defined between the projection system and the substrate, or the substrate table, or the substrate and the substrate table;
   a positioning system configured to position the substrate, or the substrate table, or the substrate and the substrate table, relative to the liquid handling system, or to the projection system, or to the liquid handling system and the projection system; and a controller to adjust at least one operating condition of the liquid handling system and/or of the positioning system during motion of the substrate and/or substrate table relative to the liquid handling system, depending on when a predefined sub-area of the substrate and/or substrate table is under the liquid handling system.

2. The immersion lithographic apparatus of claim 1, wherein the controller is configured to adjust (i) the at least one operating condition during an imaging motion of a die at least partly within a first predefined area or, (ii) the at least one operating condition during a stepping motion between adjacent dies at least partly within a second predefined area, or (iii) both (i) and (ii).

3. The immersion lithographic apparatus of claim 2, wherein the first and/or second predefined area is at or near an edge of the substrate.

4. The immersion lithographic apparatus of claim 1, wherein the predefined sub-area is defined by an ellipse.

5. The immersion lithographic apparatus of claim 1, wherein the at least one operating condition is one or more selected from:

relative speed of motion between the substrate, or the substrate table, or both, and the liquid handling system, or the projection system, or both, distance between a bottom surface of the liquid handling system and the top surface of the substrate, or the substrate table, or both, flow-rate of immersion fluid supplied to the space, level of an under pressure source that is used to extract immersion liquid, gas flow-rate used in a gas knife of the liquid handling system, angle of a lower surface of the liquid handling system relative to a surface of the substrate, fluid flow-rate of liquid out of an opening in an under surface of the liquid handling system, variation in fluid flow rate into or out of openings dependent upon their angular position relative to the direction of motion, or variation in the distance between the position of the liquid handling system relative to the substrate at the start or end of a scanning imaging motion and the furthest position in the direction of scanning imaging motion of the liquid handling system relative to the substrate prior to a subsequent scanning imaging motion.

6. The immersion lithographic apparatus of claim 1, wherein the at least one operating condition comprises at least one operating condition of the liquid handling system.

7. The immersion lithographic apparatus of claim 6, wherein the at least one operating condition of the liquid handling system is one or more selected from:

fluid flow rate through an opening of the liquid handling system, orientation of the liquid handling system relative to the projection system and/or substrate and/or substrate table, or distance between the liquid handling system relative to the projection system and/or substrate and/or substrate table.

8. The immersion lithographic apparatus of claim 1, wherein the at least one operating condition comprises at least one operating condition of the positioning system.

9. The immersion lithographic apparatus of claim 8, wherein the at least one operating condition of the positioning system is one or more selected from:

relative speed of motion between the substrate, or the substrate table, or both and the liquid handling structure, or the projection system, or both, or angle of a lower surface of the liquid handling system relative to a surface of the substrate, or distance between a bottom surface of the liquid handling system and the top surface of the substrate, or the substrate table, or both.

10. The immersion lithographic apparatus of claim 1, wherein the controller is configured to adjust the at least one operating condition only when a further condition is met.

11. The immersion lithographic apparatus of claim 10, wherein the further condition is one or more selected from:

that an imaging motion is towards an axis of symmetry of the substrate which is perpendicular to the direction of imaging and in the plane of the top surface of the substrate; or that a distance between the position at the start or end of an imaging motion and the furthest position in the direction of imaging during an adjacent stepping motion falls within a defined range; or that an imaging motion and/or stepping motion is within a certain angular range from a central position of the substrate; or that an angle, in plan, between an elongate feature which passes underneath the liquid handling system and the direction of motion of the elongate feature falls within a defined range; or a physical property of the substrate falls within a defined range.

12. The immersion lithographic apparatus of claim 10, wherein the further condition is a physical property of the substrate and the physical property is at least one or more selected from:

static contact angle of immersion liquid with a top outer edge surface of the substrate; or width of a top outer edge surface of the substrate; or static contact angle of immersion liquid with an exposed resist, topcoat, BARC, adhesion layer, Si, $SiO_2$ or metal of the top outer edge of the substrate; or width of exposed resist, topcoat, BARC, adhesive layer, Si, $SiO_2$ or metal.

13. The immersion lithographic apparatus of claim 10, wherein the further condition is that:

the locations of dies on the substrate fall within a defined area; or a length of a motion between the end of one die and the start of the next die is greater than a defined value; or both.

14. The immersion lithographic apparatus of claim 1, further comprising a manual override to allow a user to override the controller.

15. The immersion lithographic apparatus of claim 14, wherein the manual override allows overriding of adjustment of the at least one operating condition by the controller in a user defined predefined area and sets the at least one operating condition to a user defined value.

16. The immersion lithographic apparatus of claim 1, wherein motion of the predefined sub-area relative to the liquid handling system is in a direction so that at least part of an edge of the substrate moves away from the liquid handling system.

17. The immersion lithographic apparatus of claim 16, wherein a path of the liquid handling system, in the frame of reference of the substrate table, over the substrate during relative motion between the substrate table and the liquid handling system is part of a line across the substrate, and the predefined sub-area is not more than half the length of the line away from the at least part of the edge which, in the frame of reference of the liquid handling system, is moving away from the liquid handling system.

18. A method of operating a lithographic apparatus, the method comprising:
   moving a substrate table supporting a substrate relative to a projection system using a positioning system, the projection system configured to project a patterned beam of radiation through immersion liquid confined by a liquid handling system onto the substrate; and
   adjusting at least one operating condition of the liquid handling system and/or the positioning system during motion of the substrate and/or substrate table relative to the liquid handling system, depending on when a predefined sub-area of the substrate and/or substrate table is under the liquid handling system.

19. An immersion lithographic apparatus comprising:
   a substrate table configured to support a substrate;
   a projection system configured to direct a patterned beam of radiation on to the substrate;
   a liquid handling system configured to supply and confine immersion liquid to a space defined between the projection system and the substrate, or the substrate table, or the substrate and the substrate table;
   a positioning system configured to determine the relative position of the substrate, or the substrate table, or the substrate and the substrate table, relative to the liquid handling system, or the projection system, or the liquid handling system and the projection system; and
   a controller constructed and arranged to control relative motion between the substrate, or the substrate table, or the substrate and the substrate table, and the liquid handling system, or the projection system, or the liquid handling system and the projection system,
   wherein the controller is configured to lower: (i) a scanning speed between the substrate table and the projection system during imaging of a target within a predefined sub-area at or near an edge of the substrate, or (ii) a stepping speed between adjacent target positions in the predefined sub-area at or near the edge of the substrate, or (iii) the scanning speed and the stepping speed.

20. A method of operating a lithographic apparatus, the method comprising:
   moving a substrate table supporting a substrate relative to a projection system configured to project a patterned beam of radiation on to a target portion of the substrate; and
   lowering a scanning speed between the substrate table and the projection system during imaging of a target within a predefined sub-area at or near an edge of the substrate, or lowering a stepping speed between adjacent target positions in the predefined sub-area at or near the edge of the substrate, or lowering the scanning speed and the stepping speed.

* * * * *